(12) United States Patent
Cai et al.

(10) Patent No.: US 9,356,442 B2
(45) Date of Patent: May 31, 2016

(54) AREA-EFFICIENT CLAMP FOR POWER RING ESD PROTECTION USING A TRANSMISSION GATE

(71) Applicant: Hong Kong Applied Science & Technology Research Institute Company Limited, Hong Kong (HK)

(72) Inventors: Xiaowu Cai, Shenzhen (CN); Beiping Yan, Hong Kong (HK); Xiao Huo, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 169 days.

(21) Appl. No.: 14/325,559

(22) Filed: Jul. 8, 2014

(65) Prior Publication Data

US 2016/0013636 A1  Jan. 14, 2016

(51) Int. Cl.
*H02H 9/04* (2006.01)
*H01L 27/02* (2006.01)

(52) U.S. Cl.
CPC .............. *H02H 9/04* (2013.01); *H01L 27/0285* (2013.01); *H02H 9/046* (2013.01)

(58) Field of Classification Search
CPC ........................................................ H02H 9/04
USPC .............................................................. 361/56
See application file for complete search history.

(56) References Cited

U.S. PATENT DOCUMENTS

| | | | |
|---|---|---|---|
| 5,239,440 A | 8/1993 | Merrill | |
| 7,027,275 B2 | 4/2006 | Smith | |
| 7,085,113 B2 | 8/2006 | Gauthier | |
| 8,072,721 B2 | 12/2011 | Kwong et al. | |
| 8,369,054 B2 | 2/2013 | Cai et al. | |
| 8,643,988 B1 | 2/2014 | Kwong | |
| 2006/0103998 A1* | 5/2006 | Smith | H02H 9/046 361/91.1 |
| 2007/0053120 A1 | 3/2007 | Gauthier et al. | |
| 2011/0222196 A1* | 9/2011 | Smith | H02H 9/046 361/56 |

OTHER PUBLICATIONS

H. Sarbishaei, et al., "A transient power supply ESD clamp with CMOS thyristor delay element", Proc. EOS/ESD 2007.

Junjun Li, "A compact timed-shutoff, MOSFET-based power clamp for on-chip ESD protection", EOS/ESD, 2004.

* cited by examiner

*Primary Examiner* — Thienvu Tran
*Assistant Examiner* — Kevin J Comber
(74) *Attorney, Agent, or Firm* — Stuart T. Auvinen; g Patent LLC

(57) ABSTRACT

Electrostatic discharge (ESD) protection is provided by a charge-latching power-to-ground clamp circuit. A filter capacitor and resistor generate a filter voltage that is buffered by three stages to drive the gate of a BigFET such as a large n-channel transistor. A transmission gate between the stages turns off when BigFET turns on, causing charge to be latched. The filter capacitor can then discharge while the BigFET remains on. A leaker resistor slowly discharges the gate of the large BigFET and turns the transmission gate back on when the BigFET turns off after shunting the ESD current. The length of time that the clamp shunts the ESD current is determined by the leaker resistor and gate capacitance of the BigFET, not by the filter capacitor, so a small filter capacitor may be used.

18 Claims, 10 Drawing Sheets

BEFORE ESD EVENT (IF POWERED)

BEGINNING OF ESD EVENT

MIDDLE OF ESD EVENT

MIDDLE OF ESD EVENT
AFTER R-C & BEFORE RESISTOR 52 DISCHARGE

END OF ESD EVENT
AFTER R-C & RESISTOR 52 DISCHARGE

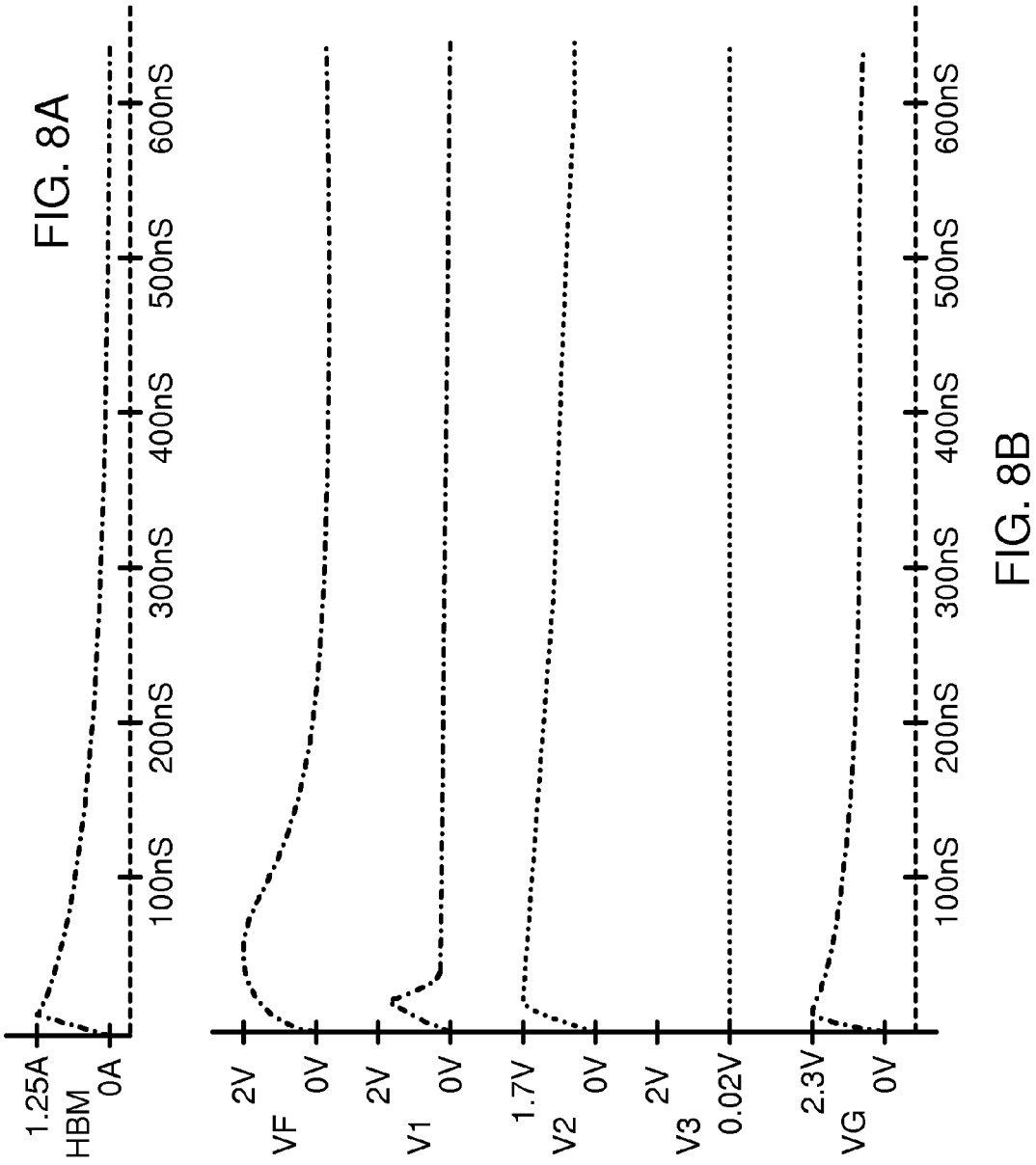

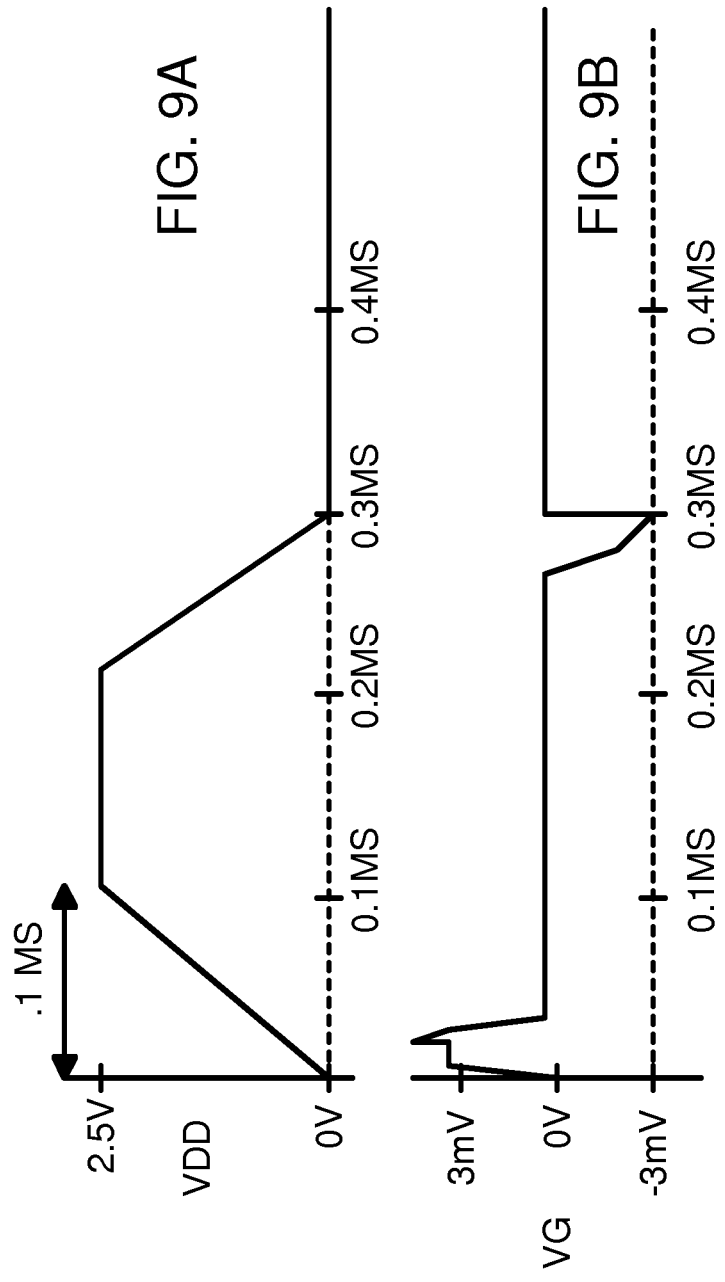

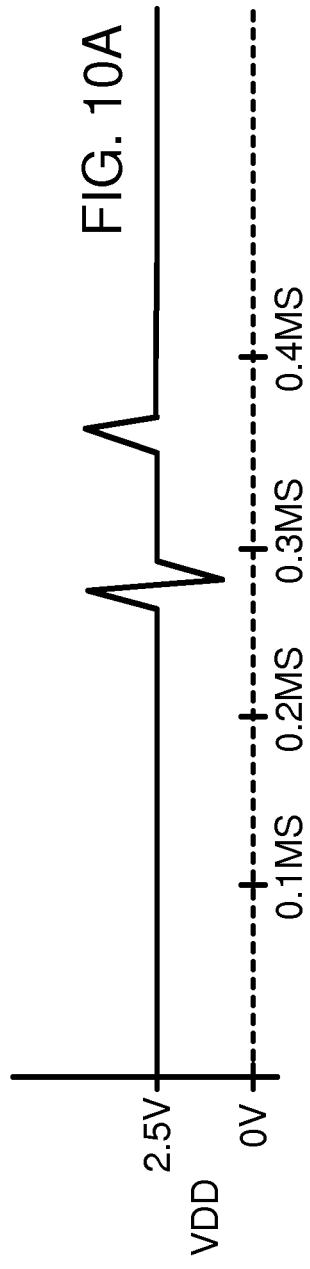
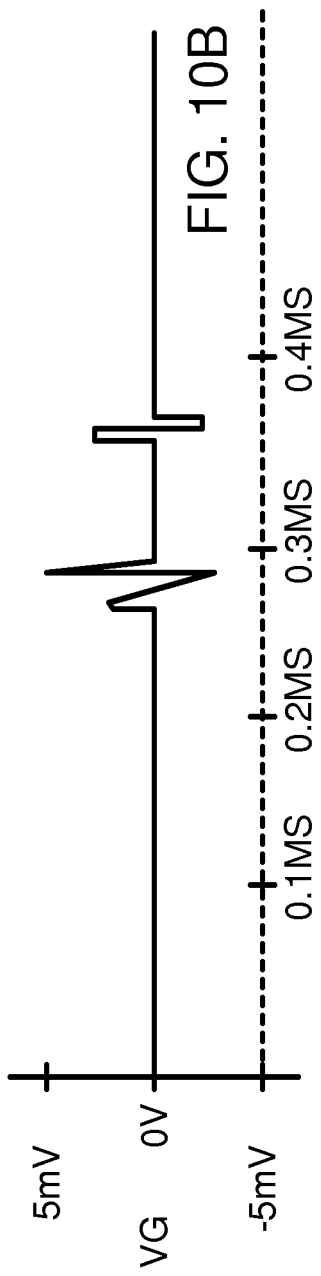

AREA-EFFICIENT CLAMP FOR POWER RING ESD PROTECTION USING A TRANSMISSION GATE

FIELD OF THE INVENTION

This invention relates to electro-static-discharge (ESD) protection circuits, and more particularly to ESD devices with a transmission gate to reduce the time constant.

BACKGROUND OF THE INVENTION

Reduction in device sizes is a key goal of improving semiconductor processes. Amazingly small transistor devices have been produced. These extremely tiny transistors have thin oxide that can be easily damaged by relatively small currents with even a moderate driving force (voltage). Special care is required when a human handles these semiconductor devices.

Static electricity that normally builds up on a person can discharge across any pair of pins of a semiconductor integrated circuit (IC or chip). IC chips are routinely tested for resistance to such electrostatic discharges (ESD) using automated testers that apply a Human-Body Model (HBM) current pulse across different pairs of pins of the chip. Any pair of pins may be chosen for the ESD test.

While input and output pins were originally provided with ESD-protection circuits, the core circuitry was directly connected to the Vdd power supply and the Vss ground supply without a power clamp for ESD protection. When an ESD pulse is applied between Vdd and Vss, the internal circuit may be damaged by the ESD pulse.

ESD protection circuits with thick oxide transistors have been used. Thick-oxide transistors are less sensitive to damage than thin-oxide transistors. In the power clamp, large transistors with gate widths of 1,000 to 5,000 μm have been used for protection. Such large transistors are usually a Field-Effect Transistor (FET) and are referred to as a BigFET.

Rather than use passive circuits, an active clamp may also be used. FIG. 1 shows a prior art power-to-ground ESD protection circuit with an active R-C triggered BigFET power clamp.

An R-C sensing element is formed by capacitor 22 and resistor 20. Inverters 10, 12, 14 invert the sensed voltage between capacitor 22 and resistor 20, and drive the gate of n-channel power clamp BigFET 18.

Under normal conditions, resistor 20 drives the input of inverter 10 high, causing a low to be driven onto the gate of n-channel BigFET 18, keeping it off. When the power-to-ground voltage suddenly spikes high, such as during an ESD event, capacitor 22 keeps the input of inverter 10 low for a period of time determined by the R-C time constant. The low input to inverter 10 drives the gate of n-channel BigFET 18 high, turning on n-channel BigFET 18 and shunting current from power to ground, dissipating the ESD pulse applied to the power line.

While such an active ESD-protection circuit is useful, it may be susceptible to noise, especially during power-up of the chip. If the active ESD-protection circuit triggers during power-up, excessive current may be drawn through the clamp transistor, resulting in big leakage or even Latch-up.

After the R-C time period has elapsed, resistor 20 pulls the input to inverter 10 high, and a low is driven onto the gate of n-channel BigFET 18, turning it off. If the R-C value is too small, the clamp turns off too soon, before all the ESD charge can be shunted to ground through n-channel BigFET 18. For the HBM, the pulse width is relatively wide, so a large R-C value (such as about 1 μs) is needed so that n-channel BigFET 18 does not turn off before the end of the HBM ESD pulse. This large R-C value results is a large size for capacitor 22. Leakage and false triggering can be a problem with the large capacitor.

Capacitor 22 may have a value of around 10 pF. The circuit of FIG. 1 may require an area of 12,000 $\mu m^2$ for a 0.35-μm CMOS process. Feedback, bistable elements, and thrysistors have been used to solve the large capacitor problem of FIG. 1. However, improved feedback circuits are still desirable.

What is desired is an ESD-protection circuit that protects the internal power supplies of an IC. An active rather than a passive protection circuit is desired. It is desired to actively enable or disable the ESD-protection circuit. It is desired to actively enable and disable a BigFET as an ESD current shunt between power and ground rings. An active ESD-protection circuit that is insensitive to noise during power up is desired. An ESD-protection circuit with improved feedback is desired to reduce the size of the capacitor. A smaller time constant and capacitor is desirable for an active clamp.

BRIEF DESCRIPTION OF THE DRAWINGS

FIG. 8A is a current waveform of a 2000V HBM ESD input pulse.

FIG. 8B shows voltage waveforms of nodes of the circuit of FIG. 2 when the HBM current pulse of FIG. 6A is applied to power.

FIGS. 9A-B simulates gate voltage that might cause leakage when Vdd is powered on using a slow rise in Vdd.

FIGS. 10A-B simulates disturbances of the gate voltage that might cause leakage when power-line noise occurs on Vdd.

DETAILED DESCRIPTION

The present invention relates to an improvement in electro-static-discharge (ESD) protection power clamps. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the n-channel BigFET must be large to shunt the large ESD current. The large gate capacitance of the BigFET can be used to advantage in setting the time constant of the clamp.

The inventors have realized that a transmission gate can be added to the inverter path in an active ESD clamp. The transmission gate can close after the beginning of an ESD event to latch charge to drive the gate of the n-channel BigFET. A leaker resistor on the gate of the n-channel BigFET can slowly dissipate the charge on the gate of the BigFET. The time constant of the triggering filter can be much smaller since the charge from the triggering filter is latched by the transmission gate. Thus a smaller filter capacitor may be used.

Figure 2:
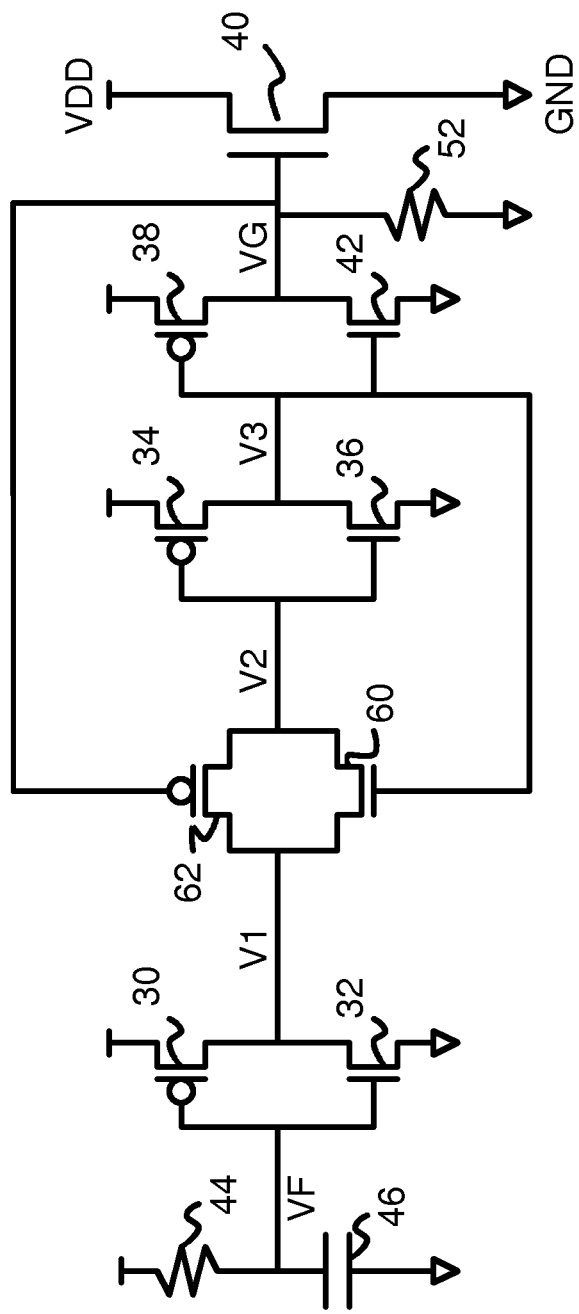
FIG. 2 is a schematic diagram of a transmission-gate-based power clamp.

FIG. 2 is a schematic diagram of a transmission-gate-based power clamp. Filter resistor 44 and filter capacitor 46 are in series between power and ground and generate a filter voltage VF on their intersecting node.

P-channel transistor 30 and n-channel transistor 32 invert VF to generate voltage V1. V1 connects to V2 through a transmission gate of p-channel transistor 62 and n-channel transistor 60. The gate of p-channel transistor 62 is VG and the gate of n-channel BigFET 40 is V3. V3 and VG are normally inverses of each other. When VG is high, turning on n-channel BigFET 40 to shunt ESD current, the transmission gate is off, latching the charge sensed from filter capacitor 46 onto nodes V2, V3, VG.

Another inversion is performed by p-channel transistor 34 and n-channel transistor 36, which receive V2 on their gates and generate V3 on their drains. A final inversion is performed by p-channel transistor 38 and n-channel transistor 42, which receive V3 on their gates and generate VG on their drains. VG is the gate voltage on the gate of n-channel BigFET 40, which shunts ESD current from power (Vdd or Vcc) to ground (Vss).

Leaker resistor 52 allows the latched charge on VG to leak away over a period of time determined by the resistance R of leaker resistor 52 and the capacitance C of node VG, which is dominated by the gate capacitance of n-channel BigFET 40. This RC time constant determines how long n-channel BigFET 40 remains on.

If the value of leaker resistor 52 were too high, VG would not be discharged adequately. However, if the value of resistor 52 were too low, the turn-on time of the power clamp would be decreased. A value of 100 K-ohm for leaker resistor 52 produces good results.

The time-constant provided by leaker resistor 52 and the large gate capacitance of n-channel BigFET 40 extends the period of time that n-channel BigFET 40 remains on. Thus a smaller R-C time constant for the filter may be used, and filter capacitor 46 may have a smaller value, area, and leakage. For example, a time constant of just 10 ns may be sufficient to turn on n-channel BigFET 40 and to trigger the transmission gate to latch the charge. Once the charge is latched on the gate of n-channel BigFET 40, the time constant of the filter is irrelevant, since the time that n-channel BigFET 40 remains on is now determined by a different R and C—that of leaker resistor 52 and the gate-to-drain capacitance of n-channel BigFET 40, not of filter resistor 44 and filter capacitor 46.

Figure 3:
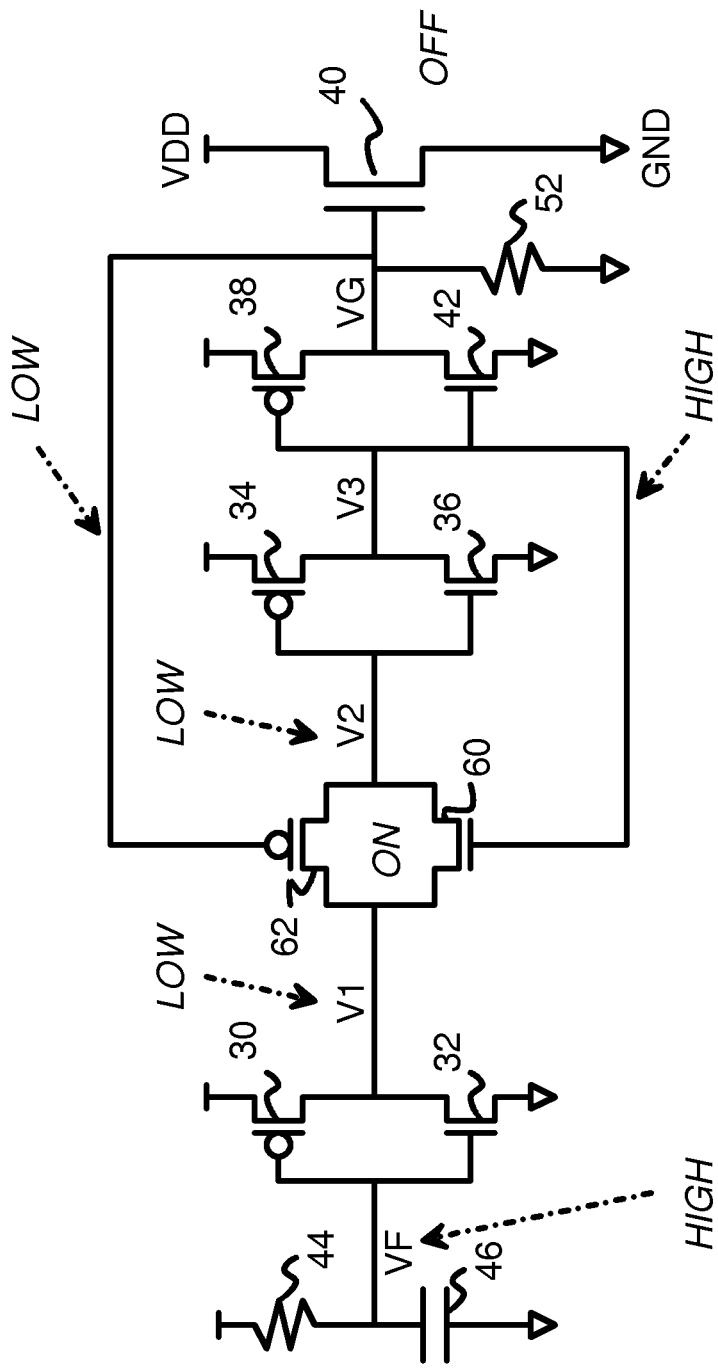
FIG. 3 highlights operation of the transmission-gate-based power clamp before an ESD event occurs.

FIG. 3 highlights operation of the transmission-gate-based power clamp before an ESD event occurs. If the device is powered, n-channel BigFET 40 should remain off when no ESD event occurs. The high power passes through filter resistor 44 to charge filter capacitor 46 so that node VF is high. The high VF is inverted by transistors 30, 32 to drive V1 low.

After a long period of time, leaker resistor 52 has fully discharged the large gate capacitance of n-channel BigFET 40, so node VG is low. The low VG turns on p-channel transmission gate transistor 62 so that the low on V1 is passed through to V2. The low V2 is inverted by transistors 34, 36 to drive V3 high, which also turns on n-channel transmission gate transistor 60.

When power is not applied to the circuit, all nodes should be low. At least one of transistors 60, 62 should turn on when an ESD event occurs. For example, while n-channel transmission gate 60 may not turn on, p-channel transmission gate transistor 62 should turn on when a positive ESD event occurs.

Figure 4:
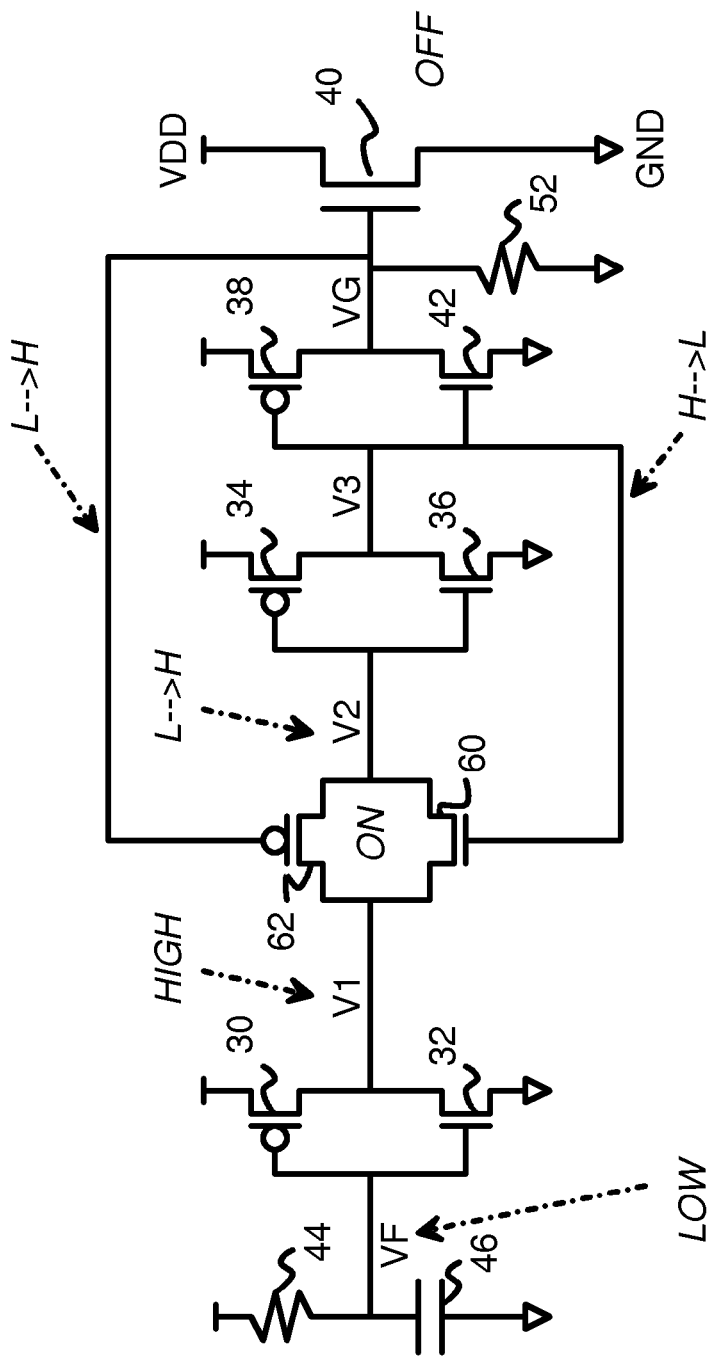
FIG. 4 highlights operation of the transmission-gate-based power clamp at the beginning of an ESD event.

FIG. 4 highlights operation of the transmission-gate-based power clamp at the beginning of an ESD event. When an ESD pulse is quickly applied to power, the internal power voltage rises quickly. However, filter capacitor 46 keeps filter voltage VF relatively low, and the current from power cannot quickly charge VF through filter resistor 44.

When an ESD pulse is coming, before the R-C time constant (10 ns) has elapsed, the voltage on VF is 0 and is considered "low". The initially low voltage on VF causes p-channel transistor 30 to turn on as its source rises in voltage with the ESD pulse applied to power. P-channel transistor 30 conducts current from power to raise the V1 voltage on its drain.

As shown in FIG. 3, VG is initially low if the device is powered, or low if no power is applied. Either way, the low of VG turns on p-channel transmission gate transistor 62, connecting the high on node V1 to drive node V2 high. When the device is powered, node V3 is high, so n-channel transmission gate transistor 60 is also conducting. When not powered, transistor 60 may remain off, but p-channel transmission gate transistor 62 conducts.

The high V2 voltage turns on n-channel transistor 36, which drives V3 low to ground. The low voltage on V3 causes p-channel transistor 38 in the third stage to turn on as its source rises in voltage with the ESD pulse applied to power. P-channel transistor 38 conducts current from power to raise the VG voltage on its drain.

Figure 5:
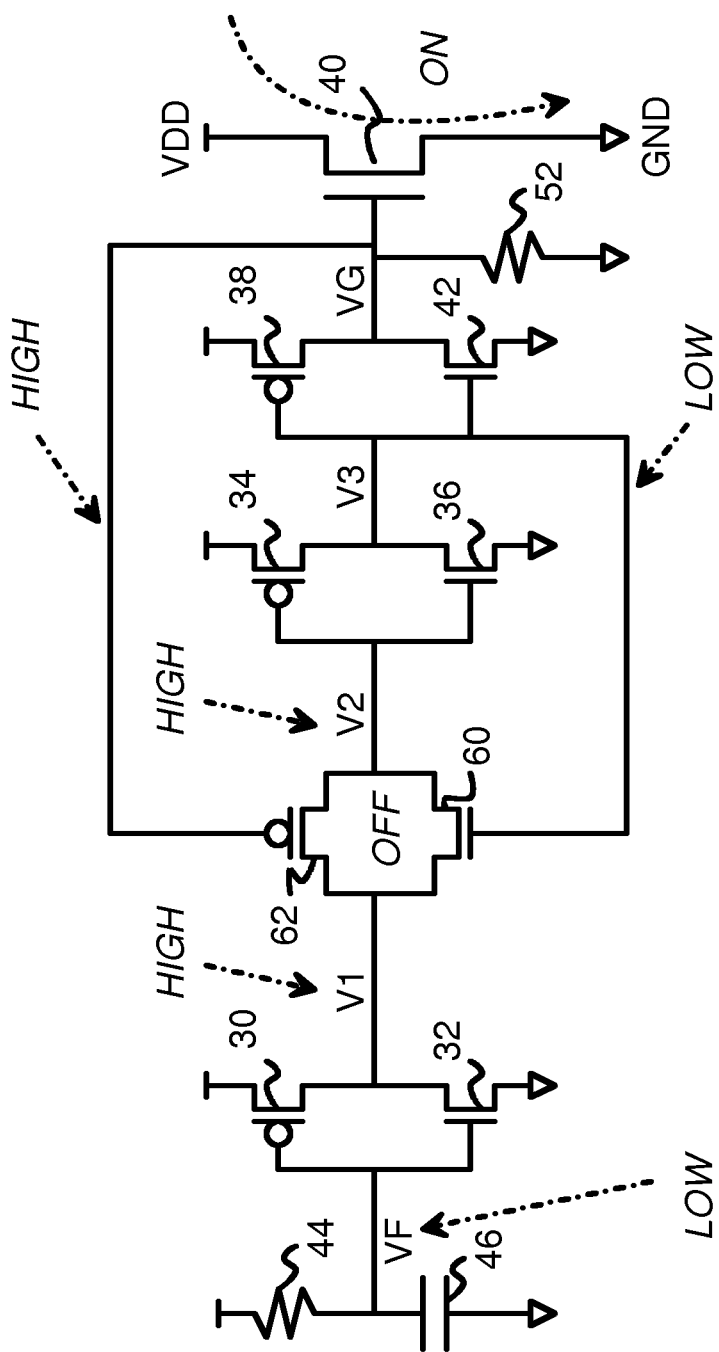
FIG. 5 highlights operation of the transmission-gate-based power clamp after the transmission gate has closed, trapping charge on the gate of the n-channel BigFET.

FIG. 5 highlights operation of the transmission-gate-based power clamp after the transmission gate has closed, latching charge on the gate of the n-channel BigFET. Once node VG is driven high by p-channel transistors 38, p-channel transmission gate transistor 62 turns off. The low on node V3 also turns off n-channel transmission gate transistor 60. Since both transmission gate transistors 60, 62 are off, the transmission gate is off, disconnecting V2 from V1. Charge is latched on node V2, the gates of transistors 34, 36. Leakage of charge from node V2 can be very small for most modern semiconductor processes, so that the charge remains latched on node V2 throughout the ESD event.

The latched high charge on node V2 is inverted to keep V3 low and VG high. The power to the source of p-channel transistor 38 is provided by the high ESD pulse. Thus VG will remain high throughout the ESD pulse, keeping the transmission gate off until leaker resistor 52 discharged VG.

The high VG voltage is applied to the gate of n-channel BigFET 40. The drain of n-channel BigFET 40 is connected to power, but the source of n-channel BigFET 40 is connected to ground. N-channel BigFET 40 turns on strongly and conducts a large current, shunting the ESD pulse from power to ground.

Leaker resistor 52 begins to conduct current from VG to ground, but the large capacitance CGD of the gate of n-channel BigFET 40 and the resistance RG of leaker resistor 52 slow down the discharge. The discharge time is a function of the time constant RG×CGD.

Figure 6:
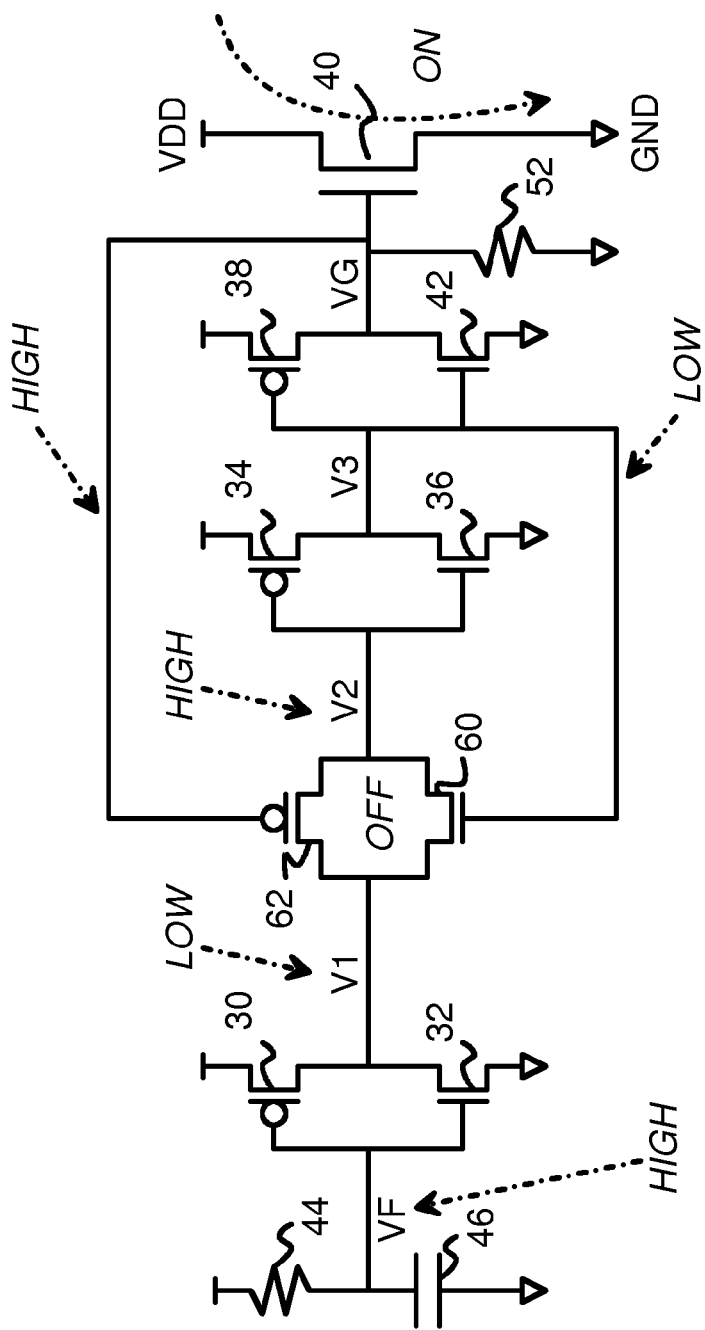
FIG. 6 highlights operation of the transmission-gate-based power clamp after the initial filter's RF×CF time constant has elapsed after the start of the ESD event.

FIG. 6 highlights operation of the transmission-gate-based power clamp after the initial filter's RF×CF time constant has elapsed after the start of the ESD event.

There are two R-C time constants in the circuit. The initial filter has a time constant of RF×CF, where RF is the resistance of filter resistor 44 and CF is the capacitance of filter capacitor 46. The gate time constant is RG×CG, where RG is the resistance of leaker resistor 52 and CG is the capacitance of the gate of n-channel BigFET 40, plus any other capacitances on gate node VG.

In the prior art, filter time constant RF×CF is large, but in the invention RF×CF is much smaller. Instead, gate time constant RG×CG is much larger than filter time constant RF×CF. At the time shown in FIG. 6, RF×CF has elapsed but RG×CG has not.

The circuit remains in the state described in FIG. 5 for a period of time about equal to the RF×CF time constant largely determined by the resistance value of filter resistor 44 and the capacitance value of filter capacitor 46.

After the RF×CF time has elapsed, filter resistor 44 has been able to charge filter capacitor 46 by conducting current from power, so that filter voltage VF rises from low to high. The high voltage VF turns off p-channel transistor 30 so that current is no longer conducted from power to V1. The high voltage VF also turns on n-channel transistor 32, driving V1 low.

However, transmission gate transistors 60. 62 remain off, so V2 remains isolated from V1. The charge latched on node V2 is not disturbed even though filter capacitor 46 has been charged. Filter capacitor 46 can have a small capacitance and size since n-channel BigFET 40 remains on due to the charge latched at node V2.

Voltage V2 floats and remains high after the RF×CF time period has elapsed. The high V2 causes V3 to remain low, which causes VG to remain high. The high VG keeps n-channel BigFET 40 turned on, and ESD current continues to be shunted from power to ground.

Leaker resistor 52 continues to conduct a small current from VG to ground, but the large capacitance CGD of the gate of n-channel BigFET 40 and the resistance RG of leaker resistor 52 slow down the discharge.

Figure 7:
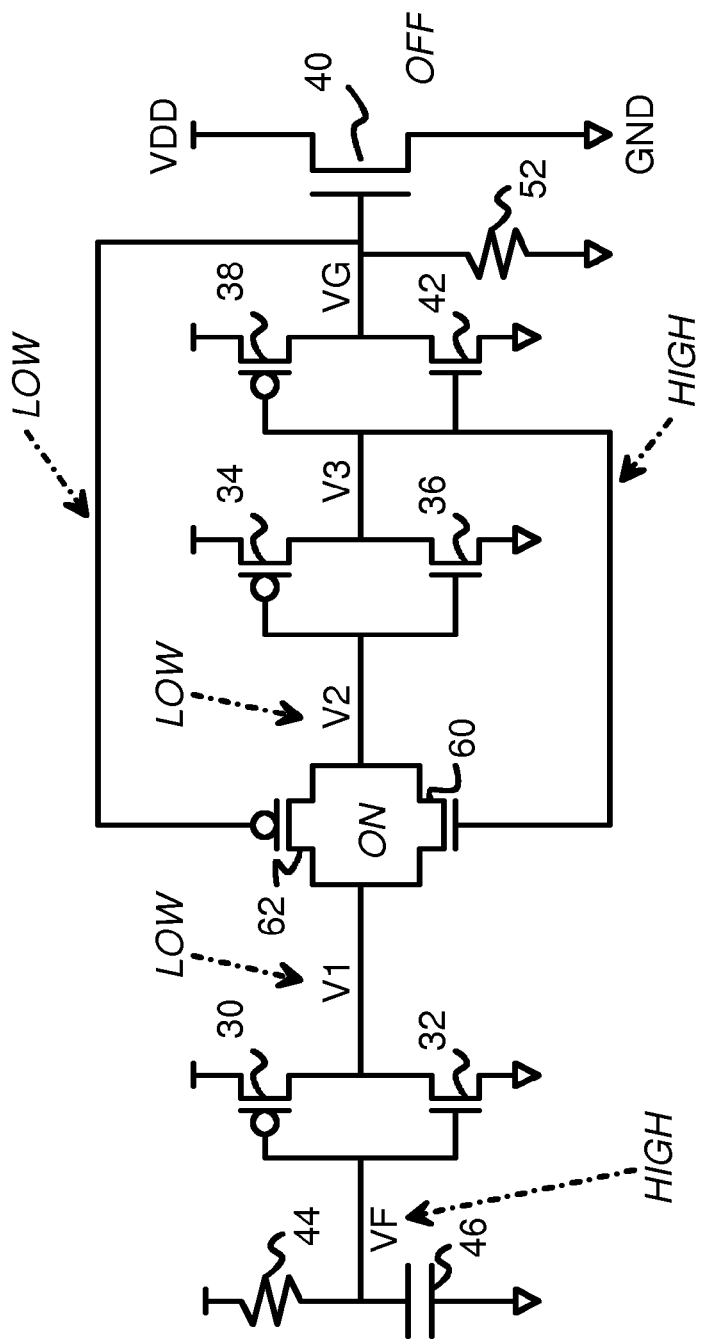
FIG. 7 highlights operation of the transmission-gate-based power clamp after the leaker resistor has discharged the gate of the BigFET.

FIG. 7 highlights operation of the transmission-gate-based power clamp after the leaker resistor has discharged the gate of the BigFET. Eventually, the small current through leaker resistor 52 is able to lower the VG voltage to below the threshold voltage of n-channel BigFET 40. Then n-channel BigFET 40 turns off. The power-to-ground shunt current stops.

The low on gate node VG turns on p-channel transmission gate transistor 62, allowing the low on node V1 to discharge the latched charge on node V2. Thus node V2 is driven low. Once V2 is below the logic switching threshold of the second stage, p-channel transistor 34 turns on, and n-channel transistor 36 turns off. Their drains, voltage V3, is actively driven from low to high. The high voltage V3 is applied to the gate of n-channel transmission gate transistor 60, causing it to turn on and more fully drive V2 low.

The high voltage V3 causes p-channel transistor 38 in the third stage to turn off, and n-channel transistor 42 to turn on. Gate voltage VG is driven low to ground. The low VG completely turns off n-channel BigFET 40. The clamp circuit then waits for the next ESD event.

The exact values of the resistors and transistors can be determined by circuit simulation for a particular semiconductor process being used. Simulation can determine values so that the circuit of FIG. 2 remains on long enough to shunt a 2000-volt HBM ESD event.

For example, when leaker resistor 52 is 100K Ohms, and the gate of n-channel BigFET 40 has a capacitance of 10 pF, n-channel BigFET 40 will remain on for almost 1 us, regardless of the value of filter resistor 44 and filter capacitor 46.

Figure 1:
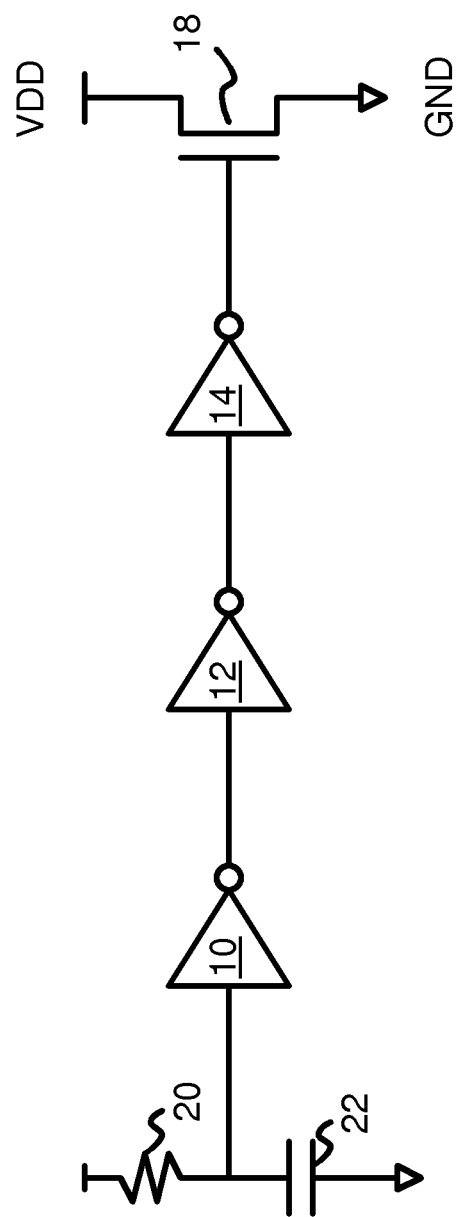
FIG. 1 shows a prior art power-to-ground ESD power clamp with an active R-C clamp.

Filter resistor 44 and filter capacitor 46 only need to be large enough for the transmission gate to latch the charge onto node V2. The RF×CF time constant can be as little as 10 ns, which can be obtained with a filter resistor 44 of 20 K Ohms, and a filter capacitor 46 of 0.5 pF. This is 20 times smaller than the 10 pF needed for prior-art capacitor 22 of FIG. 1. The area of filter capacitor 46 can be reduced from 12,000 $\mu m^2$ to 800 $\mu m^2$ for a 0.35-$\mu m$ CMOS process.

FIG. 8A is a current waveform of a HBM 2000V ESD input pulse. The current applied rises suddenly to 1.3 amps in only about 10 ns. The current then decreases over the next 600 ns.

FIG. 8B shows voltage waveforms of nodes of the circuit of FIG. 2 when the HBM current pulse of FIG. 6A is applied to power. The filter voltage VF initially is pulled low by filter capacitor 46 and then stays low for about 10 ns due to the R-C time constant of the filer, which is about 10 ns (20 K-Ohm× 0.5 pF). V1 and VG quickly rise before VF rises, while V3 remains low. This initial period to about 10 ns corresponds to the beginning of the ESD event shown FIG. 4. The high VG turns on n-channel BigFET 40 strongly, causing Vdd to start falling. Before the initial high spike of V1 falls at about 10 ns, the transmission gate turns off, latching the charge, so VG remains on long after VF falls.

After the RF×CF time constant of about 10 ns, filter resistor 44 is able to charge filter capacitor 46, raising VF. VF is inverted, causing V1 to fall. This occurs at about 10 ns in FIG. 8B. Vdd continues to fall, since VG is high and keeps n-channel BigFET 40 turned on. As Vdd falls, so does VG, which is driven from Vdd by p-channel transistors. This corresponds to FIG. 6, after the RF×CF time elapses.

The small current through leaker resistor 52 slowly discharges VG over a long period of time, from about 20 ns to almost 600 ns in FIG. 8B. Eventually this current discharges VG sufficiently so that VG switches from high to low, turning off n-channel BigFET 40. However, the HBM current ends before VG is discharged, so this is not visible in FIG. 8B.

FIGS. 9A-B simulates gate voltage that might cause leakage when Vdd is powered on using a slow rise in Vdd. The power supply Vdd rises from ground to 2.5 volts in 1 millisecond (ms) in the simulation of FIG. 9A. The simulation keeps Vdd at the normal power-supply voltage for another 0.15 ms before dropping Vdd to ground over another 0.5 ms.

In FIG. 9B, as the power voltage is slowly raised, the gate voltage VG initially rises to about 3 mV. However 3 mV is below the transistor threshold voltage, so n-channel BigFET 40 does not turn on. As Vdd continues to rise, the gate voltage is driven to ground. The gate voltage VG remains at ground until the circuit is powered off and Vdd nears ground, when the gate voltage VG falls below ground due to capacitive coupling when the n-channel transistors turn off. However, this excursion below ground is only about −3 mV. Thus n-channel BigFET 40 remains off, preventing leakage during normal power up and power down.

FIGS. 10A-B simulate disturbances of the gate voltage that might cause leakage when power-line noise occurs on Vdd. Noise of 1.5 volts is applied to Vdd over a short period of 10 ns as shown in FIG. 10A. Both positive and negative noise is simulated.

In FIG. 10B, the gate voltage VG spikes are less than 5 mV. This is below the transistor threshold and too small to turn on n-channel BigFET 40. Thus the power clamp circuit is immune to noise at these simulated levels.

False triggering of ESD protection circuits is a problem. False triggering can be caused by glitches or noise on Vdd.

The gate voltage VG remains at ground. Gate voltage VG does not get disturbed due to the glitches on Vdd. Thus the circuit has an immunity to Vdd glitches. False triggering does not occur.

ALTERNATE EMBODIMENTS

Several other embodiments are contemplated by the inventors. For example various transistor technologies may be used rather than standard complementary metal-oxide-semiconductor (CMOS). The clamping BigFET transistor can remain activated for at least ten times longer than the R-C time constant. Indeed, FIG. 8B shows the clamp remaining on for about 50 times the 10 ns time constant.

A BigFET may be an n-channel transistor or may be a p-channel transistor in some process technologies. A BigFET may be a metal-oxide-semiconductor field-effect transistor (MOSFET), however the gate may not be a true metal but may be other metal-like materials such as a silicide layer, polysilicon layer, etc. A BigFET has a gate width of 1,000 to 5,000 μm for silicon substrates, but substrates with faster mobilities such as GaAs may have a BigFET with a gate width of less than 1000 μm.

Additional process steps such as implants may be used to adjust properties of the transistors, capacitors, or other components. Guard rings or larger device sizes may also be used to strengthen the devices against high voltages. Rather than use a minimum gate length, a larger gate length may be used. The transmission gate could be inserted between the second and third stages, rather than between the first and second stages. The transmission gate could also be placed to sample the filter node, before the first inverter.

The gate of n-channel transmission gate transistor 60 could be generated by an additional inverter rather than directly from node V3. Additional inverters or delays could be added in the feedback to the gates of transmission gate transistors 60, 62. Leaker resistor 52 could be added to other nodes, such as a leaker to power from node V3, or a leaker resistor to ground from node V2.

Other implementations of the capacitors and resistors are possible in different process technologies. Longer strings of inverters can be substituted, or more complex gates other than inverters can be used. R-C elements can be added to various nodes, such as nodes within the inverter chain. Parasitic resistances and capacitance may also be present. Additional filtering or more complex filters may be used. Resistors and capacitors can be implemented in a variety of ways, and might be located under the bonding-pad metal to minimize area. The resistance and capacitance values described herein are examples only and may be varied. Transistor sizes may also vary and inverter stages can be scaled up in size when n-channel BigFET 40 is large.

Each inverter stage could be replaced with three inverters, or some other odd number of inverters. Delay lines and buffers could also be added. The terms source and drain are interchangeable, and current be considered to be positive or negative, depending on flow directions and charge.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A core protection circuit for protecting core transistors from electrostatic discharge (ESD) pulses comprising:
   a Big Field-Effect Transistor (BigFET), having a drain coupled to a power supply bus, a source coupled to a ground bus, and a gate coupled to a gate node, for shunting current during ESD pulses;
   an input filter having a filter resistor and a filter capacitor connected in series between the power supply bus and the ground bus, the input filter having a filter node between the filter resistor and the filter capacitor;
   a plurality of inverters in a chain that includes an initial inverter receiving the filter node as an input and a final inverter outputting the gate node;
   a transmission gate connected between a sampling output of a sampling inverter in the plurality of inverters and a holding input of a holding inverter in the plurality of inverters, the transmission gate isolating the holding input from the sampling output when the BigFET is turned on, the transmission gate conducting current between the sampling output and the holding input when the BigFET is turned off;
   wherein the transmission gate comprises:
      an n-channel transmission gate transistor having a gate receiving an input to the final inverter;
      a p-channel transmission gate transistor having a gate receiving the gate node;
      wherein the p-channel transmission gate transistor and the n-channel transmission gate transistor have conducting channels in parallel between the sampling output and the holding input;
   a leaker resistor that discharges stored charge to cause the gate node to turn off the BigFET after a predetermined period of time.

2. The core protection circuit of claim 1 wherein the sampling inverter is the initial inverter in the plurality of inverters, and the holding inverter has an output driving an input of the final inverter,
  wherein the plurality of inverters comprises exactly three inverters.

3. The core protection circuit of claim 1 wherein the leaker resistor is connected between the ground bus and the gate node.

4. The core protection circuit of claim 1 wherein the input filter comprises:
  the filter resistor, coupled between the power supply bus and the filter node;
  the filter capacitor, coupled between the filter node and the ground bus.

5. The core protection circuit of claim 1 wherein the predetermined period of time is a function of a resistance of the leaker resistor and a capacitance of the gate node,
  wherein the predetermined period of time is not a function of a capacitance of the filter capacitor,
  wherein the filter capacitor does not determine the predetermined period of time that the BigFET shunts current during ESD pulses.

6. An electro-static-discharge (ESD) protection device comprising:
  a clamping transistor, having a gate width of at least 1,000 microns, coupled to shunt current from an ESD pulse applied to an ESD node, having a control gate coupled to a gate node;
  a filter capacitor coupled to a filter node;
  a filter resistor coupled to the filter node;
  a first inversion stage, receiving the filter node as an input, and driving a first node as an output;
  a transmission gate having an n-channel transmission gate transistor and a p-channel transmission gate transistor with conducting channels in parallel between the first node and a second node;
  a second inversion stage, receiving the second node as an input, and driving a third node as an output;
  a third inversion stage, receiving the third node as an input, and driving the gate node as an output;
  a leaker resistor coupled to discharge the gate node;
  wherein a gate of the p-channel transmission gate transistor receives the gate node;
  wherein a gate of the n-channel transmission gate transistor receives the third node;
  whereby the clamping transistor remains on while the transmission gate isolates the first node from the second node to allow the second node to hold a charge until the leaker resistor discharges the gate node.

7. The ESD protection device of claim 6 wherein the first inversion stage, the second inversion stage, and the third inversion stage each comprise an inverter having an n-channel transistor with a grounded source and a p-channel transistor with a source connected to a power supply node, with gates connected to an input of the inverter and drains connected to an output of the inverter.

8. The ESD protection device of claim 6 wherein the filter resistor is connected between the ESD node and the filter node.

9. The ESD protection device of claim 8 wherein the filter capacitor is connected between the filter node and a ground.

10. The ESD protection device of claim 9 wherein the clamping transistor is an n-channel transistor having a source connected to the ground.

11. The ESD protection device of claim 10 wherein the clamping transistor has a drain coupled to a power supply, and a source coupled to the ground;
  wherein the ESD node is the power supply;
  whereby the clamping transistor shunts current from power to ground when the ESD pulse is applied from a power pin to a ground pin.

12. A Vdd-to-Vss electrostatic discharge (ESD) protection circuit comprising:
  a Vdd power supply;
  a Vss ground supply;
  a filter coupled between the Vdd power supply and the Vss ground supply, for generating a filter voltage on a filter node;
  a chain of inverters, receiving the filter voltage as an input, for generating a control node as an output,
  a transmission gate in series within the chain of inverters, the transmission gate holding a sampled charge within the chain of inverters and blocking the filter voltage from disturbing the sampled charge in response to an isolating signal being in an isolating state, the transmission gate allowing the sampled charge to be disturbed and unblocking the filter voltage when the isolating signal is not in the isolating state;
  wherein the transmission gate comprises:
    a p-channel transmission gate transistor having a gate that receives the control node;
    an n-channel transmission gate transistor having a gate that receives an inverse of the control node;
    wherein the p-channel transmission gate transistor and the n-channel transmission gate transistor have conducting channels in parallel;
  a clamping transistor, having a channel width of at least 1,000 microns for conducting current from the Vdd power supply to the Vss ground supply in response to the control node; and
  a leaker resistor coupled to slowly discharge the control node, wherein a rate of discharge by the leaker resistor determines a period of time that the clamping transistor conducts current;
  whereby the transmission gate in the chain of inverters blocks the filter voltage from disturbing the sampled charge to extend a time that the clamping transistor conduct current.

13. The Vdd-to-Vss ESD protection circuit of claim 12 wherein the isolating signal is the control node and the isolating state occurs when the clamping transistor is conducting current.

14. The Vdd-to-Vss ESD protection circuit of claim 12 wherein the filter comprises a filter resistor and a filter capacitor connected in series between the Vdd power supply and the Vss ground supply.

15. The Vdd-to-Vss ESD protection circuit of claim 14 wherein the chain of inverters comprises an odd number of inverting stages.

16. The Vdd-to-Vss ESD protection circuit of claim 14 wherein the clamping BigFET is an n-channel metal-oxide-semiconductor (MOS) transistor.

17. The Vdd-to-Vss ESD protection circuit of claim 16 wherein the clamping BigFET has a source connected to the Vss ground supply.

18. The Vdd-to-Vss ESD protection circuit of claim 17 wherein the chain of inverters comprises:
  a first inverter, receiving the filter node, for outputting a first node as an input to the transmission gate;
  a second inverter, receiving an output of the transmission gate, for driving a second node; and a third inverter, receiving the second node, for driving the control node.

* * * * *